(12) United States Patent
Farnworth et al.

(10) Patent No.: US 6,210,993 B1
(45) Date of Patent: Apr. 3, 2001

(54) HIGH DENSITY SEMICONDUCTOR PACKAGE AND METHOD OF FABRICATION

(75) Inventors: Warren M. Farnworth, Nampa; Salman Akram; Alan G. Wood, both of Boise; Mike Brooks, Caldwell; Eugene Cloud, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/349,417

(22) Filed: Jul. 6, 1999

Related U.S. Application Data

(62) Division of application No. 09/082,093, filed on May 20, 1998, now Pat. No. 5,990,566.

(51) Int. Cl.[7] ................................................ H01L 21/44
(52) U.S. Cl. ........................ 438/107; 438/109; 438/118
(58) Field of Search ................................ 438/106–109, 438/121, 125, 118, 119

(56) References Cited

U.S. PATENT DOCUMENTS

| | | | |
|---|---|---|---|
| 5,067,233 | * 11/1991 | Solomon | 438/107 |
| 5,104,324 | 4/1992 | Grabbe et al. . | |
| 5,107,328 | 4/1992 | Kinsman . | |
| 5,138,434 | 8/1992 | Wood et al. . | |
| 5,281,852 | * 1/1994 | Normington | 438/109 |
| 5,347,159 | 9/1994 | Khandros et al. . | |
| 5,478,781 | * 12/1995 | Bertin et al. | 438/109 |
| 5,593,927 | 1/1997 | Farnworth et al. . | |
| 5,674,785 | 10/1997 | Akram et al. . | |
| 5,678,301 | 10/1997 | Gochnour et al. . | |
| 5,696,033 | 12/1997 | Kinsman . | |
| 5,767,443 | * 6/1998 | Farnworth et al. | 439/69 |
| 5,832,601 | 11/1998 | Eldridge et al. . | |
| 5,933,712 | * 8/1999 | Bernhardt et al. | 438/107 |
| 5,990,566 | 11/1999 | Farnworth et al. . | |
| 5,995,378 | * 11/1999 | Farnworth et al. | 257/686 |
| 6,010,920 | * 1/2000 | Hellgren et al. | 438/106 |
| 6,033,931 | * 3/2000 | Hoffman et al. | 438/109 |

* cited by examiner

Primary Examiner—Kevin M. Picardat
(74) Attorney, Agent, or Firm—Stephen A. Gratton

(57) ABSTRACT

A semiconductor package and a method of fabrication are provided. The package includes multiple semiconductor dice contained in a housing, and mounted on edge to a substrate. Each die includes a polymer interconnect which attaches to a face of the die, and wraps around an end (or side) of the die. The polymer interconnect includes a flexible polymer tape with patterns of conductors. The conductors include microbumps for bonding to the die bond pads, and edge contacts for electrical connection to mating contacts on the substrate. The package also includes a force applying mechanism for biasing the dice against the substrate. In alternate embodiments, the polymer interconnect includes resilient edge contacts, cantilevered edge contacts, or multi level edge contacts.

20 Claims, 4 Drawing Sheets

HIGH DENSITY SEMICONDUCTOR PACKAGE AND METHOD OF FABRICATION

CROSS REFERENCE TO RELATED APPLICATIONS

This application is a division of application Ser. No. 09/082,093 filed May 20, 1998, now U.S. Pat. No. 5,990,566.

FIELD OF THE INVENTION

This invention relates generally to semiconductor packaging, and specifically to an improved high density semiconductor package containing multiple dice, and to a method for fabricating the package.

BACKGROUND OF THE INVENTION

Semiconductor packages can include multiple semiconductor dice in a stacked configuration. One type of package, known as a "connector", has parallel spaced cavities wherein the dice are mounted. The package can be mounted to a supporting substrate, such as a printed circuit board, to form multi chip modules and other electronic assemblies. For example, memory modules can include multiple memory devices, such as DRAMs, housed in the same package.

With some packages, direct electrical connections can be made between the bond pads on the dice, and mating contacts on the supporting substrate. Alternately, the packages can include electrical members for contacting the dice and supporting substrate. One feature of most prior art semiconductor packages is that the electrical connections between the dice and packages, or between the dice and supporting substrates, are permanent connections. For example, the connections are typically bonded connections, such as reflowed solder, or a cured conductive adhesive material.

The permanent electrical connections make assembly and disassembly of the packages difficult. In particular, the permanent electrical connections permit the packages to be assembled and disassembled only by semiconductor and electronics manufacturers having specialized equipment. It would be advantageous for packages to be constructed to allow disassembly and re-assembly by other users of the packages, such as consumers. This would permit the dice in the packages to be removed and replaced as required. For example, packages used for computer memory modules could be upgraded by consumers using the latest memory devices to replace the original dice in the packages.

Another problem with conventional semiconductor packages is stress generated by thermal cycling. In particular, the coefficient of thermal expansion (CTE) for the dice is typically different than the CTE of the packages and supporting substrates. Accordingly, the dice can expand by a different amount, stressing the electrical connections. Solder electrical connections are particularly susceptible to cracking and separation. It would be advantageous to provide packages with non-bonded electrical connections. This would permit movement of the dice to absorb thermal stresses.

Another aspect of semiconductor packages is that dice are being manufactured with large numbers of bond pads (e.g., 50 or more) which provide increased input/output paths to the integrated circuits contained on the dice. This requires a large number of electrical connections and associated electrical paths to be made to the dice. Optimally, a semiconductor package is constructed to accommodate large numbers of device bond pads.

The present invention is directed to an improved semiconductor package which can be easily disassembled and re-assembled without special equipment. In addition, the package includes resilient non-bonded electrical connections, which facilitate disassembly and re-assembly, and which absorb thermal stresses. Still further, the package can accommodate dice having large numbers of bond pads.

SUMMARY OF THE INVENTION

In accordance with the present invention an improved semiconductor package, and a method for fabricating the package are provided. The package comprises multiple semiconductor dice contained in a housing and mounted to a substrate. The housing includes a separate cavity for each die, and a force applying member for biasing the dice against the substrate. In addition, the dice include polymer interconnects bonded to their faces, and configured to provide electrical connections with the substrate.

The polymer interconnects comprise lengths of polymer tape having patterns of conductors on one side, and microbump contacts on an opposing side. The microbump contacts can be bonded to the die bond pads, with the polymer tape and conductors wrapped around the sides of the dice to form edge contacts. This construction allows the dice to be mounted on their sides (i.e., edge mounted) with the edge contacts on the polymer tape in electrical contact with mating contacts on the substrate. In addition, the edge contacts on the polymer interconnects, and the mating contacts on the substrate can include a resilient compressible member.

In accordance with the method of fabrication, a lead frame containing multiple polymer interconnects is provided. Initially, the dice are flip chip mounted to the lead frame with the die bond pads bonded to microbumps on the lead frame. Each die is then separated from the lead frame, with the polymer interconnects attached to the faces of the dice. The polymer interconnects are longer than the dice to permit folding along edges of the dice, followed by attachment to sides of the die. Exposed portions of the conductors on the polymer interconnects form edge contacts for electrically engaging the mating contacts on the substrate. The conductors can also be cantilevered from the sides of the dice to provide spring contacts, or formed in a multi-level configuration to provide ground or voltage planes on the interconnects.

Following bonding of the polymer interconnects to the dice, each die can be placed within a cavity of the housing, and the force applying member can be attached to the housing. The force applying member includes a lid that clips to the housing, and a compressible member for biasing the dice against the mating contacts on the substrate. The package can be disassembled by detaching the lid and removing the dice. This permits the dice to be replaced by an end user of the package such as a consumer.

The assembled package can be used to construct electronic devices such as multi chip modules. For example, the semiconductor dice can be provided as memory devices, such that the package forms a memory module. In addition, the substrate of the package can be provided with an edge connector or other external contacts, such that the package can be surface mounted to a printed circuit board or other supporting substrate.

DETAILED DESCRIPTION OF THE PREFERRED EMBODIMENTS

Figure 1:
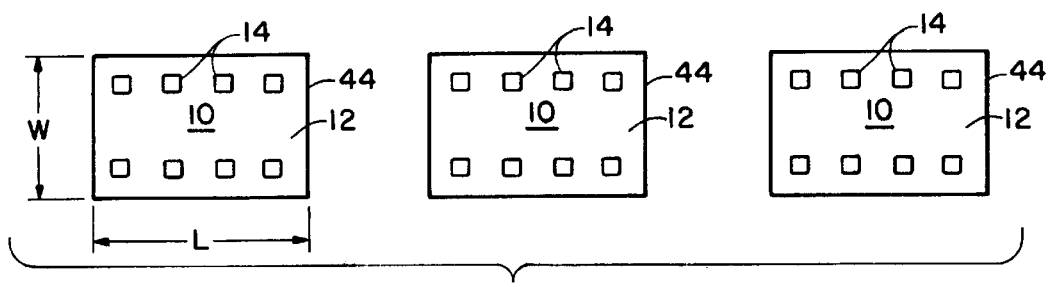
FIG. 1 is a schematic plan view of a plurality of prior art semiconductor dice.

Referring to FIG. 1, initially a plurality of conventional semiconductor dice 12 are provided. Each die 12 is generally rectangular in shape and includes a face 10 having patterns of bond pads 14 thereon. Each die 12 also includes four sides (or edges) that are generally perpendicular to the face 10, and an opposing back side that is generally parallel to the face 10.

Figure 3:
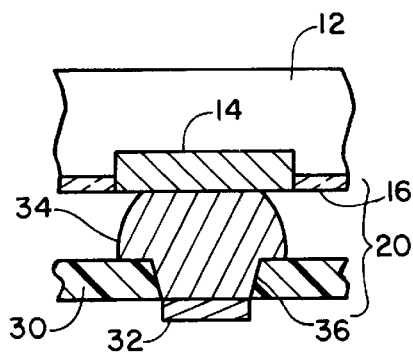
FIG. 3 is an enlarged schematic cross sectional view taken along section line 3—3 of FIG. 2 showing bonding of the dice to the lead frame.

The bond pads 14 on the face 10 of the die 12 are in electrical communication with integrated circuits contained on the die 12. Typically, the bond pads 14 comprise a thin film of aluminum embedded in a passivation layer 16 (FIG. 3). For illustrative purposes the die 12 includes eight bond pads 14 arranged in two parallel, spaced rows along opposite sides of the die 12. However, in actual practice the die 12 will typically contain 20–50 or more bond pads 14. Also, rather than being formed along the sides of the die 12, the bond pads 14 can be formed along a center line of the die 12, or in other patterns as required.

Figure 2:
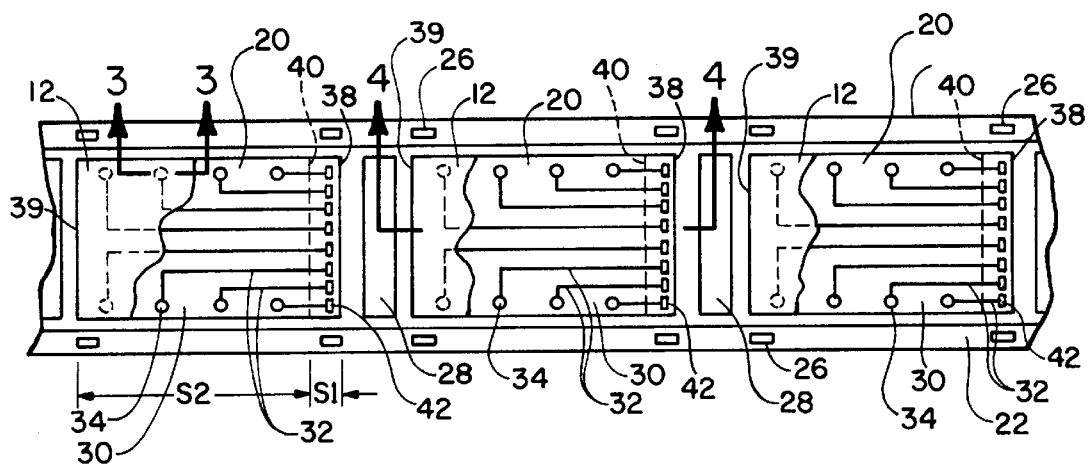
FIG. 2 is a schematic plan view, partially cut away, of a polymer lead frame constructed in accordance with the invention, and having the plurality of dice mounted thereon.

Referring to FIG. 2, a lead frame 18 containing multiple polymer interconnects 20 is provided. Each polymer interconnect 20 is configured to mount a single semiconductor die 12 thereto. The lead frame 18 comprises a multi layered tape similar to conventional TAB tape (tape automated bonding tape) used for semiconductor packaging. Representative commercial products include "ASMAT" manufactured by Nitto Denko, "GOLD DOT" manufactured by Packard Hughes, and "Z-LINK" manufactured by Sheldahl.

The lead frame 18 includes siderails 22, 24 having openings 26 that permit handling by automated machinery. The lead frame 18 also includes connecting segments 28 between the polymer interconnects 20. Following attachment of the dice 12 to the lead frame 18, the connecting segments 28 will be severed, such as by cutting, to separate the individual interconnects 20 from the lead frame 18.

Each polymer interconnect 20 includes a length of polymer tape 30 having patterns of conductors 32 and microbumps 34 formed thereon. Preferably, the polymer tape 30 comprises an electrically insulating elastomeric film, such as polyimide, having a thickness of about 0.5 to 10 mils. As shown in FIG. 3, the conductors 32 can be formed on a first side of the polymer tape 30, and the microbumps 34 can be formed on an opposing second side of the polymer tape 30. Vias 36 through the polymer tape 30 electrically connect the microbumps 34 to the conductors 32.

As also shown in FIG. 3, the microbumps 34 are configured for bonding to the bond pads 14 on the dice 12. As such, a pattern of the microbumps 34 matches a pattern of the bond pads 14 on the dice 12. A representative diameter of the microbumps 34 can be from 5 mils to 50 mils. The microbumps 34 can be formed of one or more layers of metal using a suitable deposition process such as electrodeposition. Suitable metals for the microbumps 34 include solder, Ni, Au Cu, and alloys of these metals. Alternately, the microbumps 34 can comprise a conductive polymer, such as an anisotropic or isotropic adhesive, deposited by stenciling or screen printing.

The dice 12 can be flip chip mounted to the polymer interconnects 20 by bonding the microbumps 34 to the bond pads 14 using a thermal process such as solder reflow, welding or brazing. Alternately for conductive adhesive microbumps 24, a curing process can be used to bond the microbumps 34 to the bond pads 14.

Figure 5:
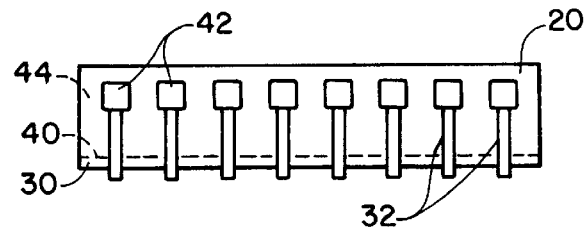
FIG. 5 is a side elevation view of the die taken along line 5—5 of FIG. 4 illustrating edge contacts on the polymer film.

As shown in FIG. 2, the conductors 32 on the polymer interconnects 20 extend in patterns to edges 38 of the interconnects 20. In addition, the conductors 32 are in electrical communication with edge contacts 42. As will be further explained, each polymer interconnect 20 will subsequently be folded along a fold line 40 so that the edge contacts 42 align with a side 44 (FIG. 5) of a die 12. A length "S1" of the segment between the fold line 40 and edge 38 of each polymer interconnect 20 is approximately equal to a thickness "T" (FIG. 4) of the die 12. A length "S1" of the segment between the fold line 40 and edge 39 of each polymer interconnect 20 is approximately equal to a length of the die 12.

Figure 4:
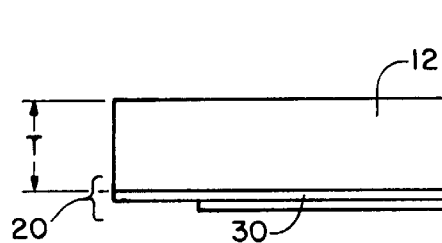
FIG. 4 is an enlarged side elevational view of a die that has been singulated from the polymer lead frame with a segment of polymer film bonded thereto to form a polymer interconnect.
Figure 6:
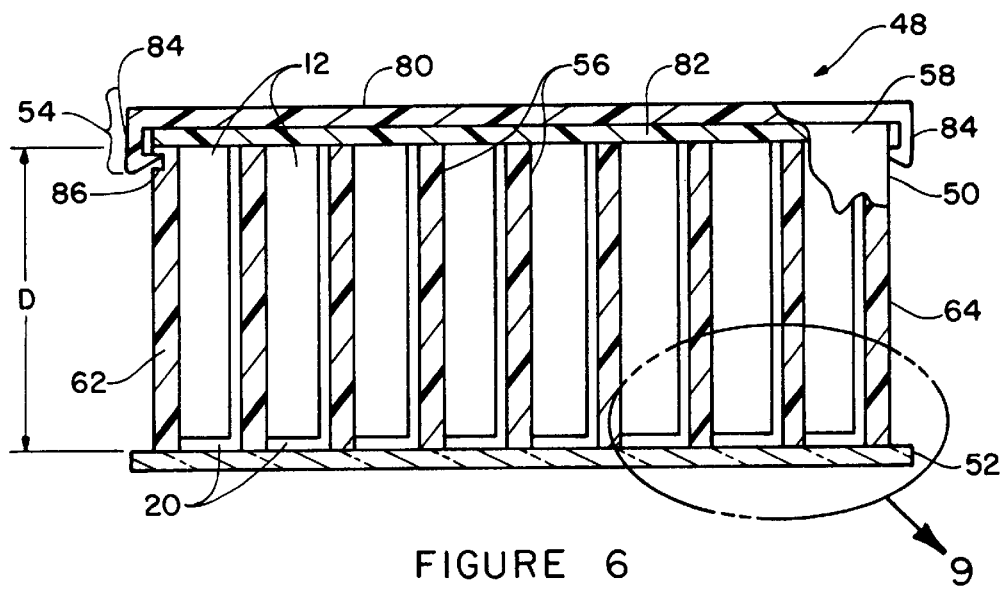
FIG. 6 is a front elevation view, partially cut away and cross sectioned, illustrating a semiconductor package constructed in accordance with the invention.

FIG. 4 illustrates a die 12 that has been bonded to a polymer interconnect 20, and separated from the lead frame 18. Following the separation process, the polymer tape 30 has been folded along fold line 40. Preferably the fold line 40 aligns with an edge or corner of the die 12. Folding of the polymer tape 30 can be accomplished using a bending tool or fixture. In addition, an adhesive layer 46 can be used to bond the folded portion of the polymer tape 30 to the side 44 of the die 12. One suitable adhesive comprises a silicone elastomer such as "ZYMET" manufactured by Zymet, Inc., East Hanover, N.J. In this configuration the edge contacts 42 on the polymer interconnect 20 align with the side 44 of the die 12. This permits the die 12 to be "edge" mounted on the side 44 and electrically connected using the edge contacts 42.

Referring to FIGS. 6–10, a semiconductor package 48 constructed in accordance with the invention is illustrated. The package 48 includes a housing 50 having a plurality of separate cavities 56 configured to contain a plurality of semiconductor dice 12. In addition, the package 48 includes a substrate 52 attached to the housing 50 and configured to provide electrical connections to the dice 12. The package 48 also includes a force applying mechanism 54 configured to bias the dice 12 against the substrate 52.

Preferably the housing 50 is a molded plastic structure that includes sidewalls 58, 60; end walls 62, 64; and partitions 66 which define the cavities 56. The housing 50 can be formed separately, and then attached to the substrate 52, using an adhesive, such as silicone or an epoxy.

In the illustrative embodiment, the housing 50 includes eight cavities 56 for retaining eight dice 12. However, a greater or lesser number of cavities 56 can be employed. Each cavity 56 has a width "W1" that is slightly larger than the thickness "T" (FIG. 4) of a single die 12 and an attached polymer interconnect 20. In addition, a width "W2" of each cavity 56 is slightly larger than the width "W" (FIG. 1) of a single die 12. A depth "D" of each cavity 56 is slightly less than a length "L" (FIG. 1) of a single die 12 and an attached polymer interconnect 20. The dice 12 can thus be slid into the cavities 56 and retained by the dimensions of the cavities 56.

Preferably the substrate 52 comprises a rigid, electrically insulating material, such as a glass filled resin (FR-4), or ceramic. The substrate 52 can also comprise silicon having an insulating layer, such as $SiO_2$, or polyimide formed thereon. In the illustrative embodiment a single housing 50 is mounted to the substrate 52. However, the substrate 52 can also be in the configuration of a circuit board, or multi chip module substrate having multiple housings 50 mounted thereon.

Figure 7:
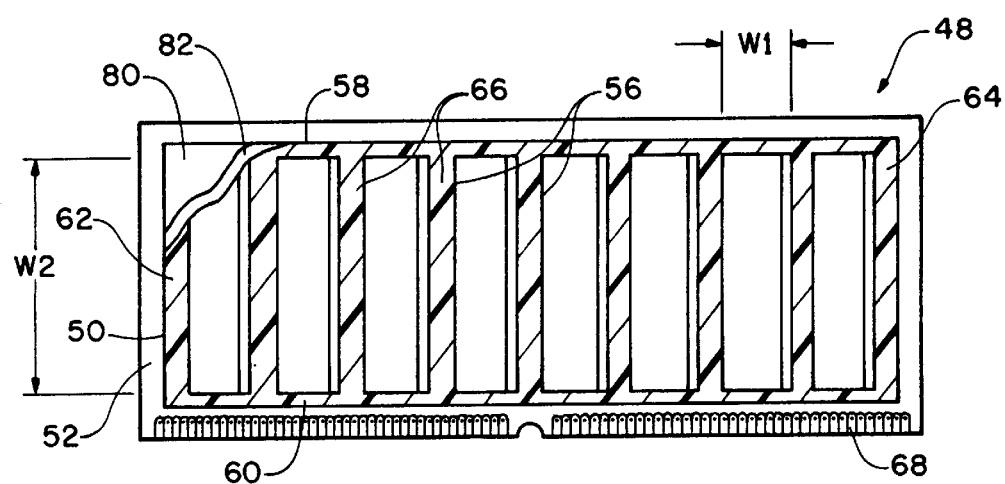
FIG. 7 is a plan view, partially cut away and cross sectioned, of the package.
Figure 8:
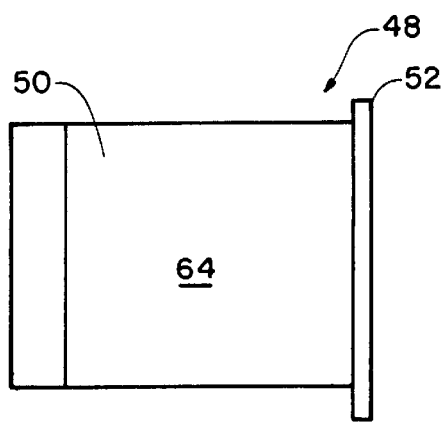
FIG. 8 is a side elevation view of the package.

As shown in FIG. 7, in the illustrative embodiment the substrate 52 includes an edge connector 68. The edge connector 68 can be configured for removable electrical connection to a mating electrical receptacle (not shown) on a circuit board, control panel or other electronic assembly. Alternately, instead of an edge connector 68, the substrate 52 can be provided with external contacts such as leads, pins or balls.

Figure 9:
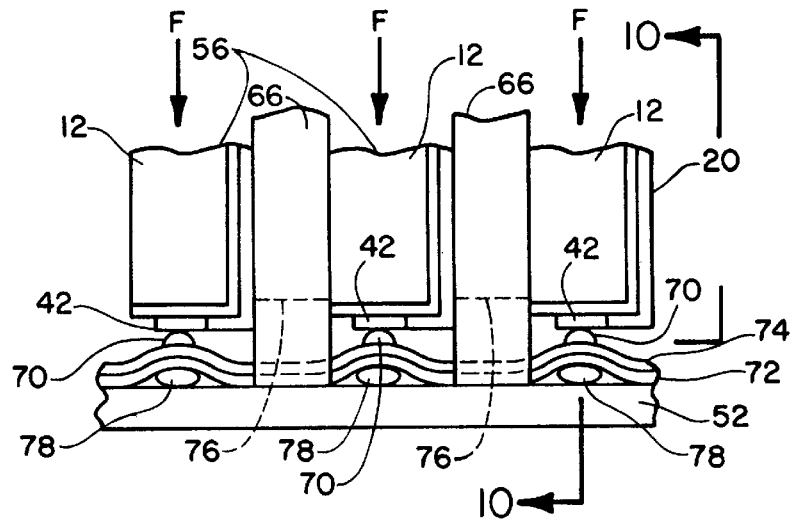
FIG. 9 is an enlarged schematic view of a portion of the package taken along section line 9—9 of FIG. 6 showing resilient contacts on a substrate of the package.
Figure 10:
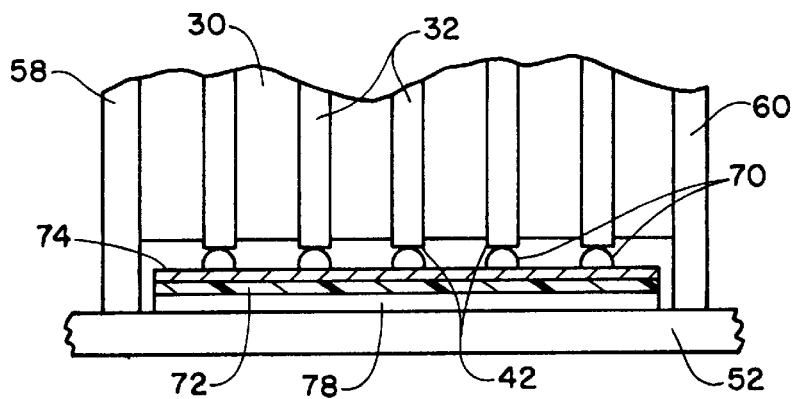
FIG. 10 is a schematic cross sectional view taken along section line 10—10 of FIG. 9.
Figure 9A:
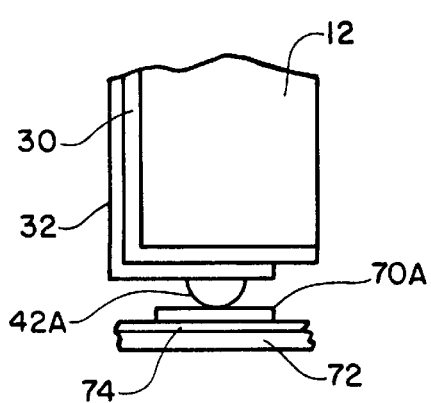
FIG. 9A is an enlarged schematic view equivalent to FIG. 9 of alternate embodiment resilient contacts.

As shown in FIGS. 9 and 10, the substrate 52 includes resilient contacts 70 configured to electrically engage the edge contacts 42 on the polymer interconnects 20 attached to the dice 12. In the illustrative embodiment, the resilient contacts 70 comprise metal or conductive polymer microbumps, similar to the microbumps 34 (FIG. 3) previously described. However, the resilient contacts 70 are adapted to form non-bonded rather than bonded connections with the edge contacts 42. Alternately as shown in FIG. 9A, resilient contacts 70A can comprise planar pads and edge contacts 42A can comprise bumps or spheres of a conductive material.

The resilient contacts 70 are in electrical communication with patterns of conductors 74 mounted on a polymer tape 72. The resilient contacts 70, conductors 74 and polymer tape 72 can comprise multi layered TAB tape as previously described. In addition, the polymer tape 72 can include an integral ground plane for matching impedance and reducing cross talk between the conductors 74.

The polymer tape 72 can be adhesively bonded, or laminated, to the substrate 52. In addition, the polymer tape 72 can be mounted to the substrate 52 with the conductors 74 thereon in electrical communication with the edge connector 68 (FIG. 7) on the substrate 52. Preferably, the partitions 66 on the housing 50 include openings 76 proximate to the substrate 52 to provide clearance for the polymer tape 72 and the conductors 74.

Also, a plurality of compressible members 78 can be mounted between the substrate 52 and polymer tape 72 to provide additional resiliency or compliancy for the resilient contacts 70. The compressible members 78 can comprise an elastomeric material, such as silicone, in a foam, gel or molded configuration. Alternately, the compressible members can comprise cured silicone strips or dots, or alternately deposited dots or strips, which are then cured. Silicone strips or dots are commercially available from Dow Chemical Co.

Referring again to FIG. 6, the force applying mechanism 54 is illustrated. The force applying mechanism 54 includes a lid 80 which attaches to the housing 50. The force applying mechanism also includes a compressible member 82 which bias the dice 12 against the substrate 52.

In the illustrative embodiment, the lid 80 comprises a one piece molded plastic member. However, the lid 80 can also be formed of metal or other rigid material. The lid 80 includes latching portions 84 which engage mating indentations 86 formed in the end walls 62, 64 of the housing 50. The latching portions 84 can be molded integrally with the lid 80, or formed as separate members attached to the lid 80.

The compressible member 82 can be attached to the lid 80 or can be a separate member placed within the housing 50 for contact by the lid 80. The compressible member 82 is adapted to exert a force "F" (FIG. 9) on the dice 12. This biases the dice 12 against the substrate 52 and maintains electrical contact between the edge contacts 42 (FIG. 10) on the polymer interconnects 20, and the resilient contacts 70 (FIG. 10) on the polymer tape 72.

The compressible member 82 can comprise a compressible elastomeric material, such as silicone. Suitable elastomeric materials include "PORON" and "BISCO" available from a Dow Chemical subsidiary. Rather than being formed of elastomeric materials, the compressible member 82 can comprise a liquid or gas filled bladder. This type of bladder is available from Paratech of Frankfort, Ill. under the trademark "MAXI FORCE AIR BAG".

With this construction the lid 80 and compressible member 82 can be detached from the housing 50 for removing the dice 12. The dice 12 can then be replaced with other dice without requiring a bonded connection with the substrate 52. However, for some applications it may be desirable to form bonded connections between the edge contacts 42 (FIG. 10) and the resilient contacts 70 (FIG. 10). In this case a bonding process such as solder reflow, soldering, brazing, or welding can be employed. A conductive polymer material, such as an isotropic or anisotropic adhesive, can also be employed to make bonded connections. In this case the conductive polymer material can be applied to the edge contacts 42 (FIG. 10), or to the resilient contacts 70 (FIG. 10), as a viscous material, which is cured by heating or outgassing a solvent to form a permanent conductive bond. In a similar manner, the edge contacts 42 or the resilient contacts 70 can comprise a conductive polymer material that is cured to form a permanent conductive bond.

Figure 11:
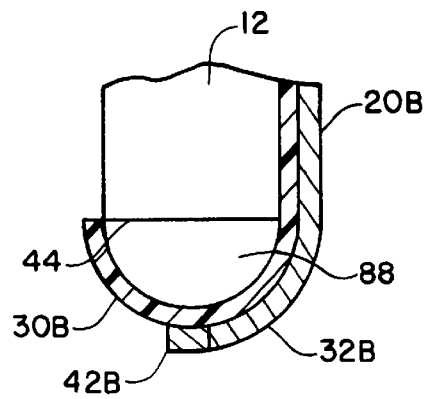
FIG. 11 is a schematic cross sectional view of an alternate embodiment semiconductor die having the polymer film bonded thereto with a compressible member therebetween.

Referring to FIG. 11, an alternate embodiment polymer interconnect 20B is illustrated. The polymer interconnect 20B includes a polymer tape 30B having conductors 32B and edge contacts 42B formed substantially as previously described for tape 30, conductors 32 and contacts 42. The polymer interconnect 20B also includes a compressible member 88 mounted between the side 44 of the die 12 and the polymer tape 30B. The compressible member 88 can be formed of a resilient polymeric material such as silicone or rubber.

Figure 12:
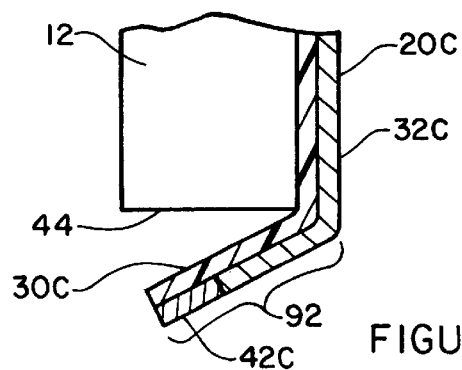
FIG. 12 is a schematic cross sectional view of an alternate embodiment semiconductor die having a polymer film bonded thereto with a cantilevered spring contact.
Figure 13:
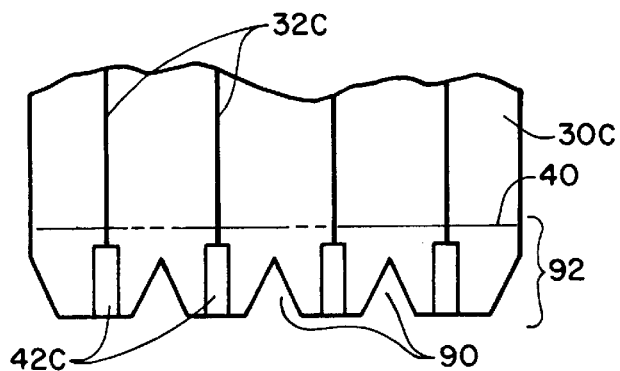
FIG. 13 is a schematic plan view of the polymer film of FIG. 12 shown separately and illustrating cut outs on the polymer film for forming the spring contacts.

Referring to FIGS. 12 and 13, an alternate embodiment polymer interconnect 20C is illustrated. The polymer interconnect 20C includes a polymer tape 30C having conductors 32C and edge contacts 42C substantially as previously described. However, in this embodiment end portions 92 of the conductors 32C are cantilevered from the side 44 of the die 12 to form resilient spring contacts, similar in shape to "gull wing" contacts. The cantilevered end portions 92 provide a spring force for biasing the edge contacts 42C against the resilient contacts 70 (FIG. 10). In order to cantilever the end portions 92 cut outs 90 can be formed in the polymer tape 30C. Also, the conductors 32C can be formed of a naturally resilient material such as beryllium copper.

Figure 14:
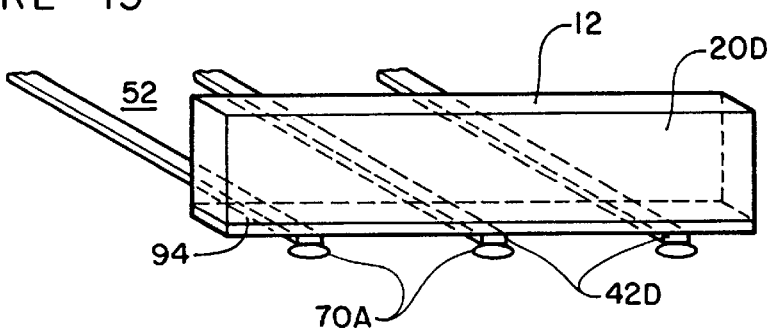
FIG. 14 is a schematic perspective view of an alternate embodiment semiconductor die having edge contacts on a longitudinal edge in electrical engagement with mating electrodes on a substrate.

Referring to FIG. 14, an alternate embodiment polymer interconnect 20D is illustrated. The polymer interconnect 20D is formed substantially as previously described but with edge contacts 42D formed on a side 94 of the die 12. In addition, the resilient contacts 70A on the substrate 52 comprise parallel spaced conductive traces.

Figure 15:
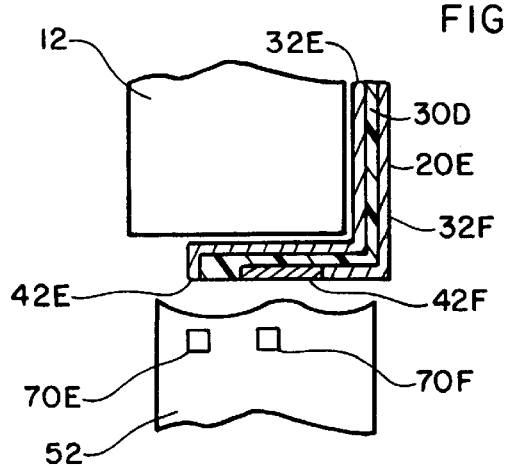
FIG. 15 is a schematic side elevation view of an alternate embodiment semiconductor die having interlevel conductors and mating contacts on a substrate.

Referring to FIG. 15, an alternate embodiment polymer interconnect 20E is illustrated. The polymer interconnect 20E is formed substantially as previously described but includes a polymer interconnect 20E having multi level conductors 32E, 32F formed on a polymer tape 30D. For example, conductors 32E can be formed on a first side of the tape 30D, and conductors 32F can be formed on an opposing second side of the tape 30D. If desired, one level of conductors (either 32E or 32F) can be a ground plane for matching the impedance of the conductors as previously described. In a similar manner, one level of conductors (either 32E or 32F) can function as a voltage plane. The multi level conductors 32E, 32F include edge contacts 42E and 42F respectively. The edge contacts 42E and 42F mate with resilient contacts 70E and 70F on the substrate 52.

Thus the invention provides an improved semiconductor package and method of fabrication. One advantage of the package is assembly, disassembly and re-assembly are facilitated by non-bonded electrical connections. In addition, the edge mounting of the dice allow high device densities in a relatively compact package. Still further, an impedance of conductors on the polymer interconnects and on the substrate can be matched by providing an integral ground plane.

While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor package comprising:
   providing a substrate;
   providing a first contact on the substrate comprising a first polymer film, and a compressible member between the substrate and the first polymer film;
   providing a semiconductor die comprising a face, a side and a pad on the face;
   attaching a second polymer film to the face and to the side of the die, the second polymer film comprising a bump bonded to the pad and an edge contact proximate the side of the die; and
   mounting the die on the side to the substrate with the edge contact on the second polymer film and the first contact on the substrate biased into electrical contact by the compressible member.

2. The method of claim 1 wherein the compressible member comprises silicone.

3. The method of claim 1 wherein the mounting the die step comprises providing a housing with a cavity configured to mount the die on the side to the substrate.

4. A method for fabricating a semiconductor package comprising:
   providing a substrate;
   forming a first contact on the substrate by mounting a first polymer film comprising a bump to the substrate, and placing a compressible member between the substrate and the first polymer film;
   providing a semiconductor die comprising a face, a side, and a pad on the face;
   attaching a second polymer film to the face and to the side of the die, the second polymer film comprising a conductor in electrical communication with the pad and an edge contact proximate the side of the die; and
   mounting the die on the side to the substrate with the edge contact on the second polymer film and the bump on the substrate biased into electrical contact by the compressible member.

5. The method of claim 4 wherein the attaching the second polymer film step comprises bonding a second bump on the second polymer film, which is in electrical communication with the conductor, to the pad.

6. The method of claim 4 wherein the mounting the die to the substrate step comprises providing a housing attached to the substrate comprising a cavity for mounting the die on the edge.

7. The method of claim 4 further comprising placing a second compressible member between the die and the edge contact during the attaching step.

8. A method for fabricating a semiconductor package comprising:
   providing a substrate comprising a first contact;
   providing a semiconductor die comprising a face, a pad on the face, and a side;
   providing a polymer film comprising a conductor in electrical communication with the pad and an edge contact proximate the side of the die;
   attaching the polymer film to the face of the die with the conductor in electrical communication with the pad and at least a portion of the conductor and the edge contact cantilevered across the side of the die and configured to provide a spring force; and
   mounting the die on the side to the substrate with the edge contact on the polymer film biased by the spring force into electrical contact with the contact on the substrate.

9. The method of claim 8 wherein the first contact comprises a bump on a second polymer film attached to the substrate.

10. The method of claim 8 wherein the first contact comprises a conductive polymer.

11. The method of claim 8 wherein the polymer film comprises a plurality of interlevel conductors including at least one ground or voltage plane.

12. A method for fabricating a semiconductor package comprising:

providing a substrate;

providing a first polymer film, a first contact on the first polymer film and a first compressible member between the first polymer film and the substrate;

providing a housing comprising a cavity;

mounting the housing on the substrate;

placing a semiconductor die into the cavity, the die comprising a second polymer film attached to a face and a side of the die, the second polymer film comprising a second contact bonded to a pad on the die, and an edge contact in electrical communication with the second contact and located proximate to the side of the die;

attaching a lid to the housing and a second compressible member between the lid and the die; and biasing the edge contact on the die and the first contact on the substrate into electrical contact using the first compressible member and the second compressible member.

13. The method of claim 12 wherein the edge contact comprises a metal or a conductive polymer bump.

14. The method of claim 12 further comprising placing a third compressible member between the edge contact and the die.

15. The method of claim 12 wherein the first compressible member comprises an elastomeric material.

16. The method of claim 12 wherein the second compressible member comprises a bladder or an elastomeric material.

17. A method for fabricating a semiconductor package comprising:

providing a substrate comprising a first contact;

providing a semiconductor die comprising a side, a face and a pad on the face;

attaching a polymer film to the face of the die, the polymer film comprising a conductor in electrical communication with the pad and a second contact proximate the side of the die, the second contact and at least a portion of the conductor cantilevered over the side of the die and configured to exert a spring force; and mounting the die on the side to the substrate with the second contact on the polymer film biased against the first contact on the substrate by the spring force.

18. The method of claim 17 wherein the substrate comprises a housing having a cavity, and mounting the die to the substrate comprises placing the die in the cavity.

19. The method of claim 17 wherein the housing further comprises a lid and a compressible member for biasing the die against the substrate.

20. The method of claim 17 wherein the portion of the conductor comprises beryllium copper.

* * * * *